(12) United States Patent
Huang

(10) Patent No.: US 7,631,402 B2
(45) Date of Patent: Dec. 15, 2009

(54) RETAINING DEVICE FOR HEAT SINK

(76) Inventor: Po-Hui Huang, No.7, Lane 75, Anhe Rd., Tanzi Shiang, Taichung County (TW)

( * ) Notice: Subject to any disclaimer, the term of this patent is extended or adjusted under 35 U.S.C. 154(b) by 472 days.

(21) Appl. No.: 11/732,173

(22) Filed: Apr. 2, 2007

(65) Prior Publication Data

US 2007/0212905 A1    Sep. 13, 2007

(30) Foreign Application Priority Data

Nov. 3, 2006    (TW) .............................. 95219397 U

(51) Int. Cl.
   *A44B 21/00*    (2006.01)
   *H05K 7/20*    (2006.01)
   *F28F 7/00*    (2006.01)
(52) U.S. Cl. .................. 24/457; 361/704; 165/80.2; 165/80.3
(58) Field of Classification Search .............. None
   See application file for complete search history.

(56) References Cited

U.S. PATENT DOCUMENTS

| | | | | |
|---|---|---|---|---|
| 6,318,452 B1 * | 11/2001 | Lee | ............. | 165/80.3 |
| 6,731,504 B1 * | 5/2004 | Liu | ............. | 361/704 |
| 7,013,537 B2 * | 3/2006 | Lin et al. | ............. | 24/457 |
| 7,061,764 B2 * | 6/2006 | Lai et al. | ............. | 361/704 |
| 7,292,442 B2 * | 11/2007 | Yu et al. | ............. | 361/704 |
| 7,333,333 B2 * | 2/2008 | Zhao et al. | ............. | 361/700 |
| 7,375,965 B2 * | 5/2008 | Xia et al. | ............. | 361/704 |
| 7,397,663 B2 * | 7/2008 | Chen et al. | ............. | 361/704 |
| 7,409,751 B2 * | 8/2008 | Chen et al. | ............. | 24/455 |
| 7,409,752 B2 * | 8/2008 | Chen | ............. | 24/459 |
| 7,430,121 B2 * | 9/2008 | Lu et al. | ............. | 361/719 |
| 7,467,443 B2 * | 12/2008 | Lin | ............. | 24/459 |
| 7,522,420 B2 * | 4/2009 | Yan | ............. | 361/704 |
| 7,564,689 B1 * | 7/2009 | Guo et al. | ............. | 361/704 |
| 7,576,987 B2 * | 8/2009 | Lai et al. | ............. | 361/704 |
| 2004/0064924 A1 * | 4/2004 | Franke et al. | ............. | 24/458 |
| 2004/0179340 A1 * | 9/2004 | Lin | ............. | 361/704 |
| 2004/0190262 A1 * | 9/2004 | Lai et al. | ............. | 361/704 |
| 2005/0066487 A1 * | 3/2005 | Zhang | ............. | 24/457 |
| 2005/0144764 A1 * | 7/2005 | Lin | ............. | 24/459 |
| 2006/0034057 A1 * | 2/2006 | Yang | ............. | 361/704 |
| 2007/0025083 A1 * | 2/2007 | Lin | ............. | 361/704 |
| 2007/0115638 A1 * | 5/2007 | Yu et al. | ............. | 361/704 |
| 2008/0256764 A1 * | 10/2008 | Hsu | ............. | 24/457 |

* cited by examiner

*Primary Examiner*—Jack W. Lavinder
(74) *Attorney, Agent, or Firm*—Charles E. Baxley

(57) ABSTRACT

A retaining device for a heat sink includes a retaining piece, a retaining arm, a connection seat and a control member. The retaining piece has one end formed with a retaining hole and a top end formed with two tabs. The retaining arm has a vertical surface formed with a retaining hole. The tabs penetrate through the retaining arm and then the connection seat having an accommodating slot. The control member has a disk and a handle connected thereto. The disk in the accommodating slot has a hollow eccentric control slot. A pivot mounted to the tabs may slide in the control slot. The control member is rotated to move the pivot, which causes a relative movement between the retaining piece and the connection seat so that the retaining hole retains a mounting seat of the heat sink while the retaining arm tightly presses against the heat sink.

8 Claims, 7 Drawing Sheets

US 7,631,402 B2

RETAINING DEVICE FOR HEAT SINK

BACKGROUND OF THE INVENTION

1. Field of the Invention

The invention relates to a retaining device for a heat sink and to the retaining and positioning technology for a central processing unit and the heat sink applied to the heat dissipating field of a digital data processing device, and more particularly to a retaining device for a heat sink capable of simplifying a positioning device of the invention and ensuring the good retaining effect.

2. Description of the Related Art

A central processing unit (CPU) is a heart for a digital processing device. The CPU generates heat as it is operating. In order to dissipate the heat of the CPU and thus to prevent the heat from influencing the operating efficiency of the CPU, a retaining device is provided to fix a fin-like heat sink to the CPU. As shown in FIG. 8, the retaining device includes a retaining arm 75, a retaining piece 80, a combination seat 85 and a switch element 90. The retaining arm 75 has one end formed with a retaining hole 76 and the other end, into which the retaining piece 80 may be inserted vertically. The bottom end of the retaining piece 80 is also formed with a retaining hole 81. The retaining piece 80 penetrates through the top end of the retaining arm 75 and then inserted into and positioned at the combination seat 85. The combination seat 85 is disposed in the hollow switch element 90, which has two guiding bevels 91 and 911 with different heights and arced surfaces on two sides of the switch element 90. Two pairs of positioning slots 93 at different levels are provided in conjunction with the guiding bevels 91 and 911. The top end of the retaining piece 80 projects over the combination seat 85 and the switch element 90 so that a shaft rod 94 may penetrate through the corresponding holes of the retaining piece 80 and two ends of the shaft rod 94 may be bracketed by the positioning slots 93.

Thus, a mounting seat 71, on which the CPU 73 and a heat sink 74 may be stacked, is disposed on a mainboard 70. Corresponding engaging blocks 72 on the external side of the mounting seat 71 engage with the retaining hole 81 of the retaining piece 80 and the retaining hole 76 of the retaining arm 75, respectively. Then, the switch element 90 is actuated to rotate relative to the combination seat 85 so that the switch element 90 is thus moved and the higher positioning slots 93 engage with the shaft rod 94. Thus, the shaft rod 94 and the retaining piece 80 are pulled up in a straight line direction so that the inner bottom edge of the retaining hole 81 of the retaining piece 80 tightly presses against the bottom side of the engaging block 72. Thus, the retaining arm 75 elastically presses against the heat sink 74 to retain the heat sink 74 in the mounting seat 71 and thus to attach the heat sink 74 to the CPU 73.

However, the shape of the switch element of the retaining device is quite complicated. For example, the guiding bevels with different levels and arced surfaces and two pairs of positioning slots with different levels cannot be easily formed on the circumferential side of the hollow body of the switch element. In addition, the machined shape of the combination seat is not simple because the combination seat has to be positioned to the retaining piece without rotation. Also, two sides of the top end of the retaining piece are not symmetrical. Thus, the cost has to be increased because many elements have complicated structures. The difficulty in the machining technology is increased and the stable quality cannot be ensured.

SUMMARY OF THE INVENTION

It is therefore an object of the invention to provide a retaining device for a heat sink having the simplified structure, the low cost and the effective retaining effect.

The invention achieves the above-identified object by providing a retaining device for a heat sink. The retaining device includes a retaining piece, a retaining arm, a connection seat and a control member. The retaining piece has a distal end formed with a retaining hole, and a top end formed with two opposite tabs. One side of the retaining piece is connected to a connection section. The retaining arm has an inverse L-shape. A vertical surface at one side of the retaining arm is formed with a retaining hole, an end plane at the other side of the retaining arm is formed with through holes through which the tabs penetrate, and the plane is stopped by the connection section. The connection seat presses against the plane of the retaining arm. Open slots are formed on two symmetrical sides of the connection seat and facing the tabs, the other two symmetrical sides of the connection seat are integrally formed with an accommodating slot, and the connection seat is formed with scarf joints corresponding to the tabs passing through the connection seat. The control member has a disk and a handle connected to an outer periphery of the disk. A thickness section of the disk is accommodated in the accommodating slot, the handle is exposed out of the connection seat, the disk is formed with a hollow and eccentric control slot corresponding to a top side of each of the tabs. Thus, a pivot may slide in the control slot, the control member in the accommodating slot is rotated and the pivot is driven by the control member to cause a relative movement between the retaining piece and the retaining arm.

According to the retaining device, the invention has the following advantages.

First, the elements of the invention are simpler, the cost can be effectively reduced, and the product competitiveness can be enhanced. The control member is the simple flat disk having a control slot, which is simple and may be easily and precisely formed. The two tabs of the retaining piece are symmetrical and the connection seat is the simple base, so the elements have the simple shape and the low cost and may be easily machined.

Second, the control member of the invention is disposed in the accommodating slot of the connection seat and only has to be rotated unidirectionally. So, the space required by the control member and the size of the control member are smaller than those in the prior art, and the control flow is smoother.

Third, rotating the control member having the eccentric control slot can retain the retaining piece and the connection seat together or loosen the mounting seat on the heat sink because the radial distances from two ends of the control slot to the center of the control member are different from each other. The pivot only has to be moved in the control slot. The contact surface between the pivot and the inner surface of the control slot only covers the axial thickness section of the disk. So, the contact surface and the friction force are smaller, and the control member can move the connection seat and the retaining piece in a smoother manner.

Further benefits and advantages of the present invention will become apparent after a careful reading of the detailed description with appropriate reference to the accompanying drawings.

BRIEF DESCRIPTION OF THE DRAWINGS

The above and other objects of the present invention will become readily apparent by reference to the following detailed description when considered in conjunction with the accompanying drawings wherein.

DETAILED DESCRIPTION OF THE INVENTION

Figure 1:
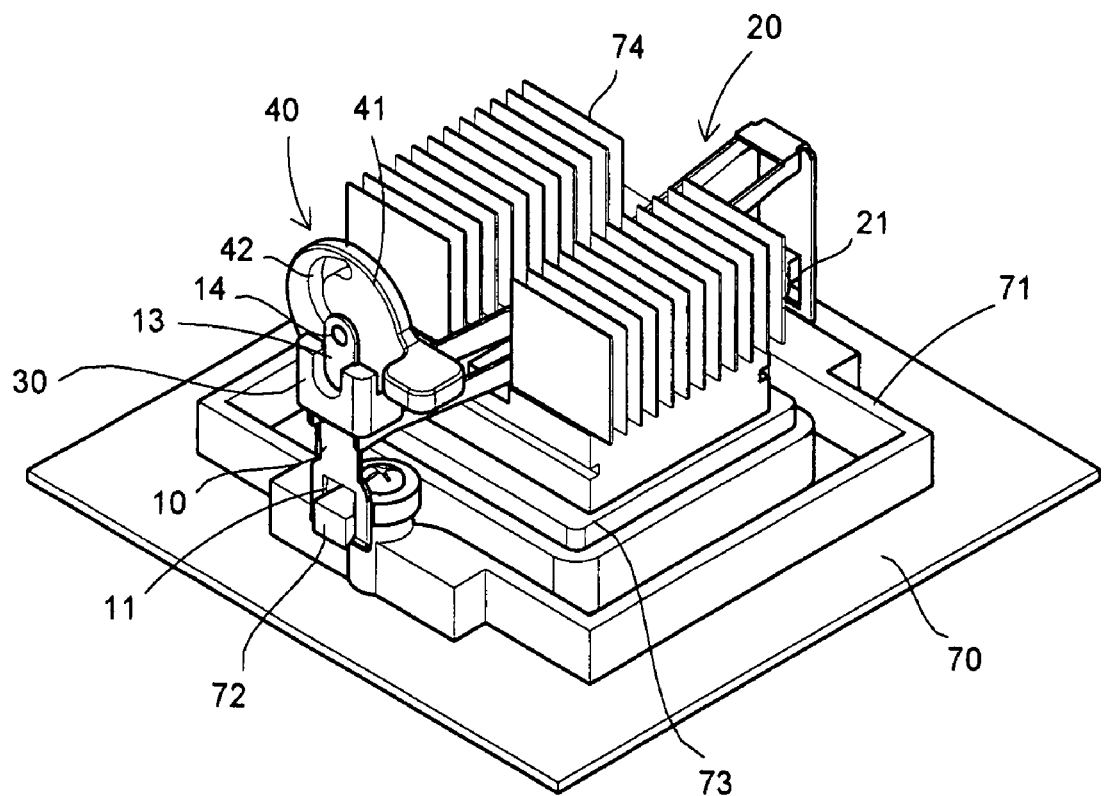
FIG. 1 is a pictorially assembled view showing a retaining device for a heat sink according to a preferred embodiment of the invention.

The invention provides a retaining device for a heat sink, as shown in FIG. 1. A mounting seat 71 is disposed on a mainboard 70. Two sides of the mounting seat 71 are formed with engaging blocks 72, respectively. A heat sink 74 is to be disposed on a central processing unit (CPU) 73. In this invention, the retaining device for positioning the heat sink 74 on the mainboard 70 includes a retaining piece 10, a retaining arm 20, a connection seat 30 and a control member 40, which constitute the retaining device having a simple structure and can effectively retain the heat sink 74 onto the mainboard 70.

Figure 2:
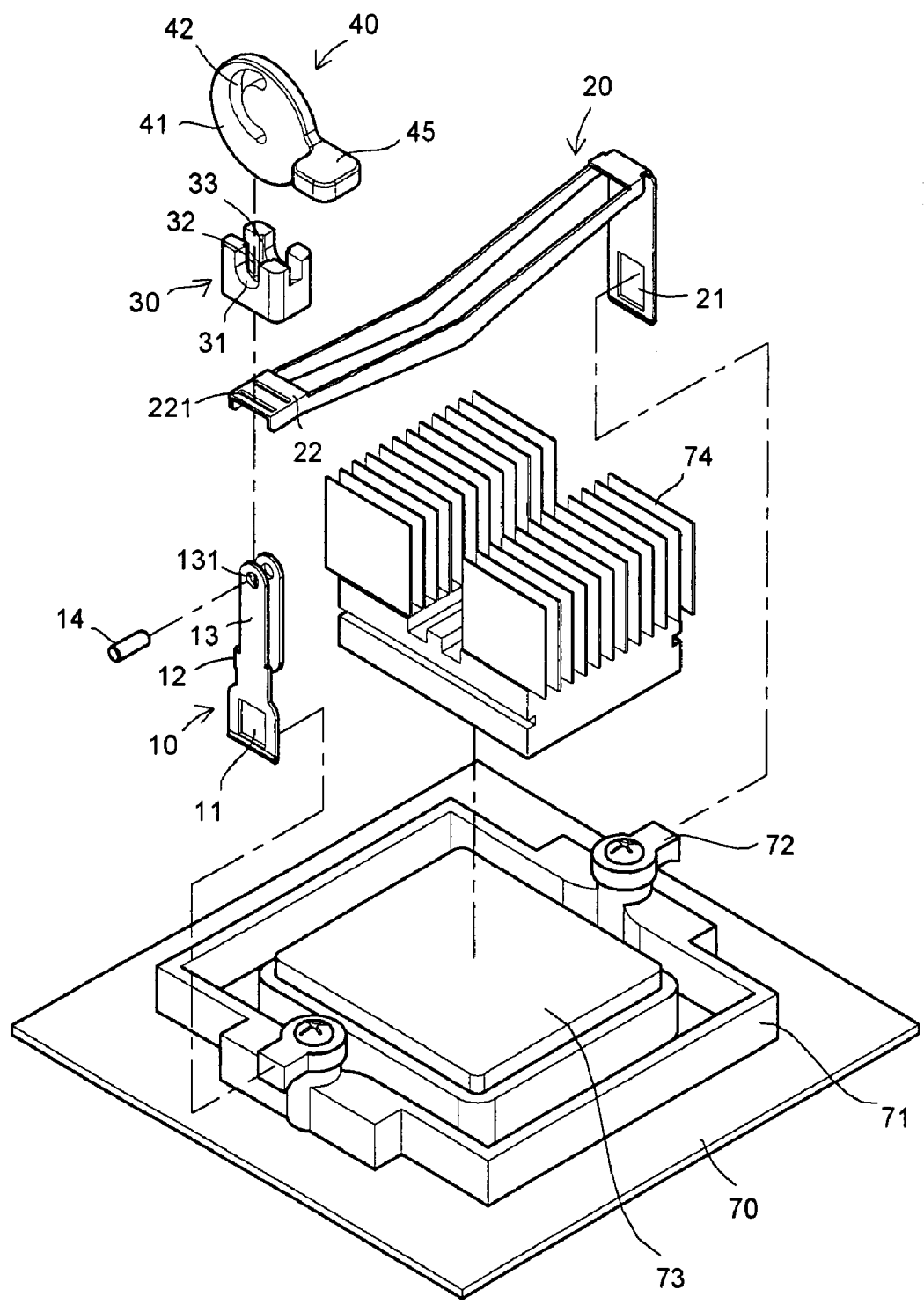
FIG. 2 is a pictorially exploded view showing the retaining device for the heat sink according to the preferred embodiment of the invention.
Figure 3:
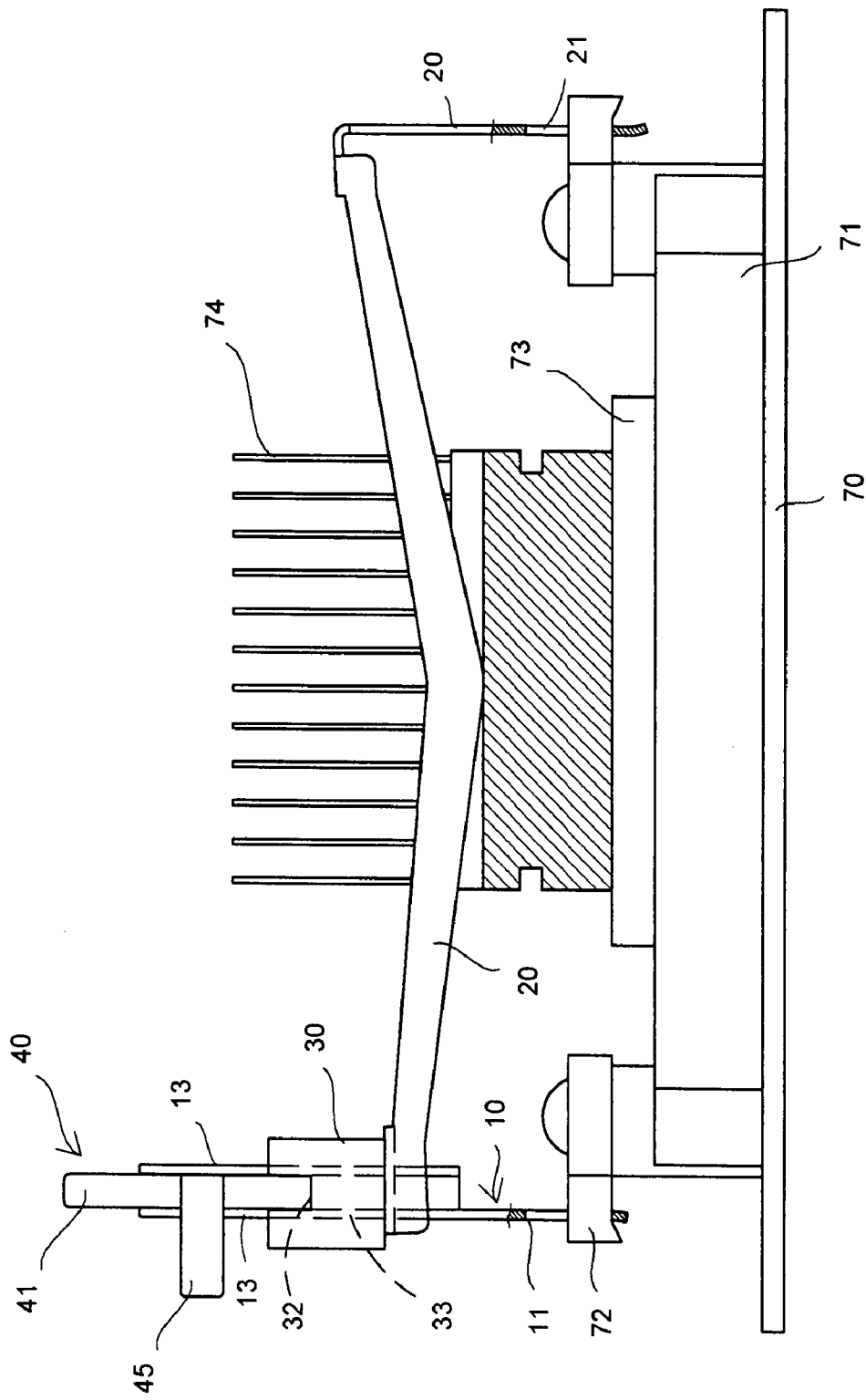
FIG. 3 is a side view showing a retaining state of the retaining device according to the preferred embodiment of the invention.

As shown in FIGS. 1 to 3, the retaining piece 10 is formed with a retaining hole 11 at a distal end thereof, and formed with a tab 13 at a top end thereof. One side of the retaining piece 10 laterally extends to form a connection section 12, and the connection section 12 extends upwards to form another tab 13. Thus, two opposite and longitudinal tabs 13 are formed, and the tabs 13 are formed with through holes 131 having the same axis.

The retaining arm 20 has an inverse L-shape. A vertical surface on one side of the retaining arm 20 is formed with a retaining hole 21. An end plane 22 on the other side of the retaining arm 20 is formed with two through holes 221 through which the tabs 13 may pass. In addition, the connection section 12 can stop the retaining arm 20 to prevent the retaining arm 20 from moving toward the retaining hole 11 of the retaining piece 10.

Figures 4, 5:
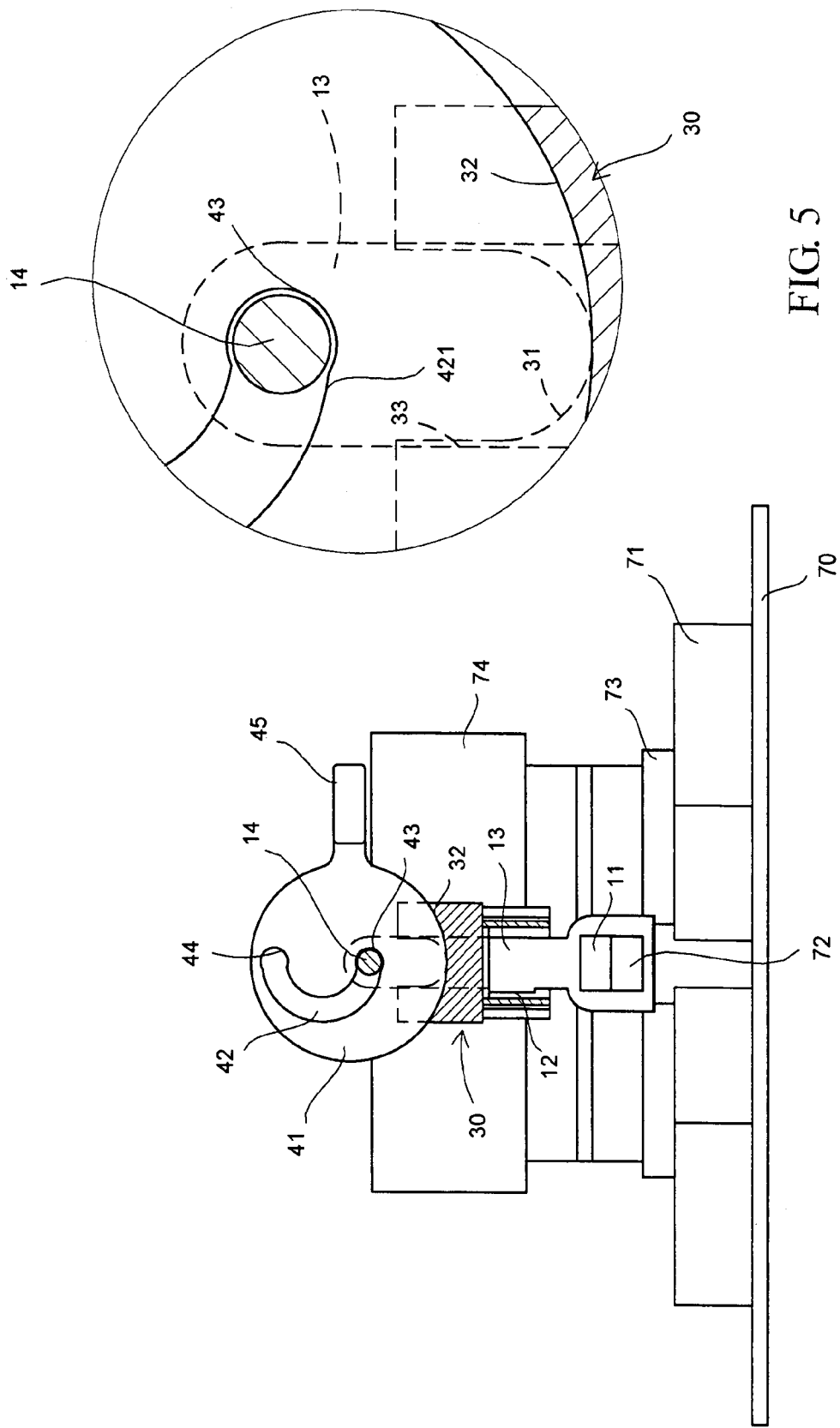
FIG. 4 is a front view showing the retaining state of the retaining device according to the preferred embodiment of the invention.
FIG. 5 is an enlarged front view showing a connection portion of a control slot, a connection seat and tabs according to the preferred embodiment of the invention.

The connection seat 30 capable of pressing against the plane 22 is shown in FIGS. 2, 4 and 5. The connection seat 30 is a base, which is formed with U-shaped open slots 31 on two symmetrical sides and facing the tabs 13 of the retaining piece 10. Two other symmetrical sides of the connection seat 30 extending in a different direction are integrally formed with a curved accommodating slot 32. The connection seat 30 is also formed with scarf joints 33 on two inner sidewalls of the open slots 31 and facing the corners of the open slots 31. The scarf joints 33 are aligned with the through holes 221 of the plane 22, respectively, so that the scarf joints 33 allow the tabs 13 of the retaining piece 10 to slide vertically therein without laterally movement. Thus, the two tabs 13 face each other in the connection seat 30 and are accommodated in the accommodating slot 32, and a thickness section of the disk is accommodated in the accommodating slot.

The control member 40 has a disk 41 and a handle 45. The disk 41 is a circular flat block formed with an arced control slot 42. The control slot 42 has one end defined as a locking point 43 near a center of the disk 41, and the other end defined as a releasing point 44 near an outer periphery of the disk 41. The handle 45 is connected to one side of the disk 41 and extends radially from the center of the disk 41 to make the control member 40 be easily rotated. The control slot 42 has small convexities 421 near the locking point 43 and the releasing point 44 so that the control slots 42 are formed with two bottlenecks at the two points, as shown in FIG. 5.

Thus, as shown in FIGS. 3 to 5, the tabs 13 of the retaining piece 10 pass through the through holes 221, enter the scarf joints 33 and correspond to the control slot 42. Thus, a pivot 14 passes through the through holes 131 and the control slot 42 to make the control member 40 rotate eccentrically. The rotating control member 40 drives the pivot 14 to move the retaining piece 10 and the retaining arm 20 upwards so that the pivot 14 slides in the control slot 42 until the pivot 14 is moved to the locking point 43 of the control slot 42 (i.e., the distance from the point of the slot to the other side of the disk is longer). In this case, the inner bottom edge of the retaining hole 11 presses against the engaging block 72. Then, the disk 41 applies a force, which relatively presses the retaining arm 20, to the connection seat 30 to make the retaining arm 20 lying on the heat sink 74. The small convexities 421 are adjacent to the locking point 43 (the other small convexities 421 are adjacent to the releasing point) and near the pivot 14, and provides the function of easing the sliding of the pivot 14 so that a delay is provided and the pivot 14 cannot easily slide.

Figure 6:
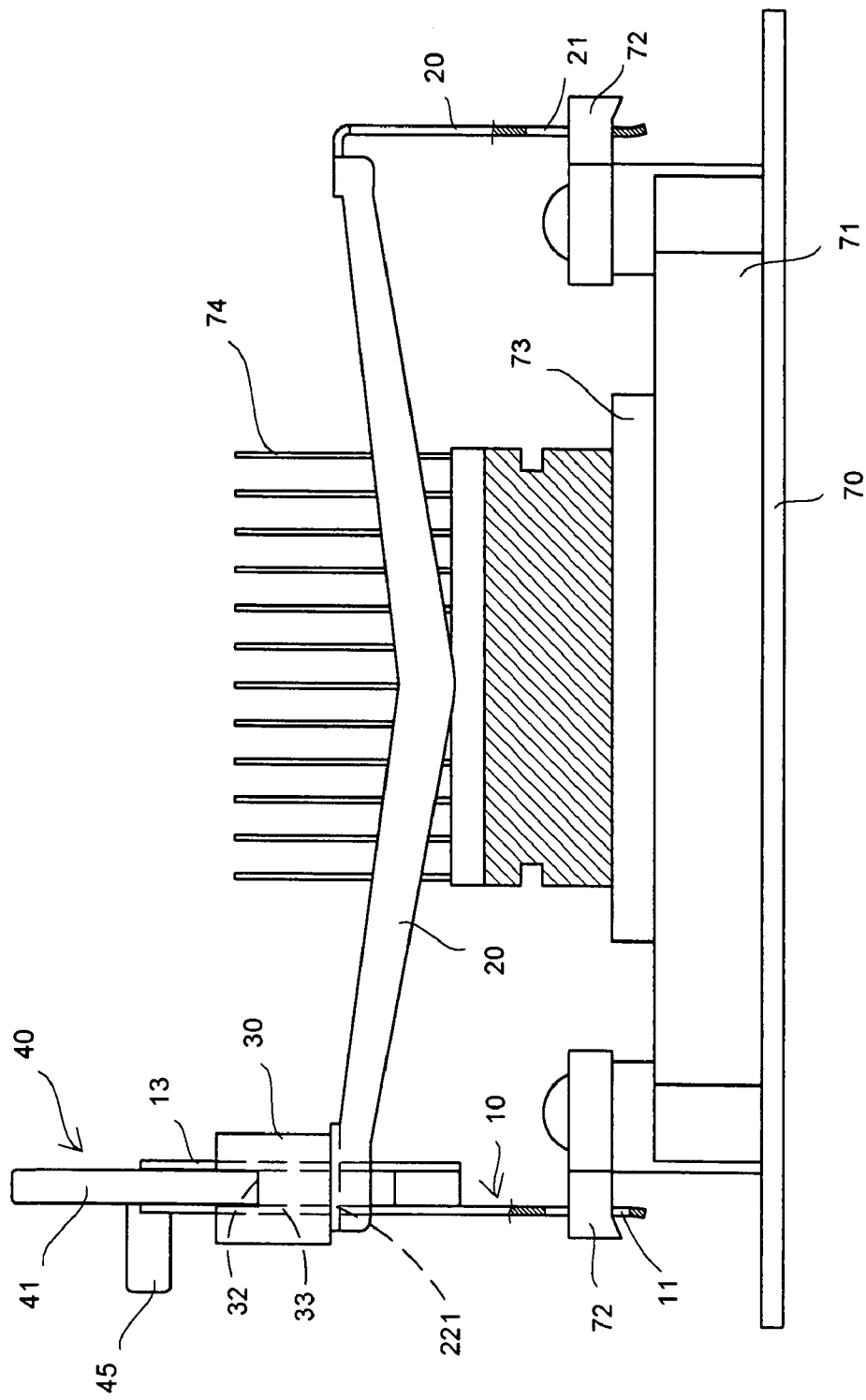
FIG. 6 is a side view showing a loose state of the retaining state according to the preferred embodiment of the invention.
Figure 7:
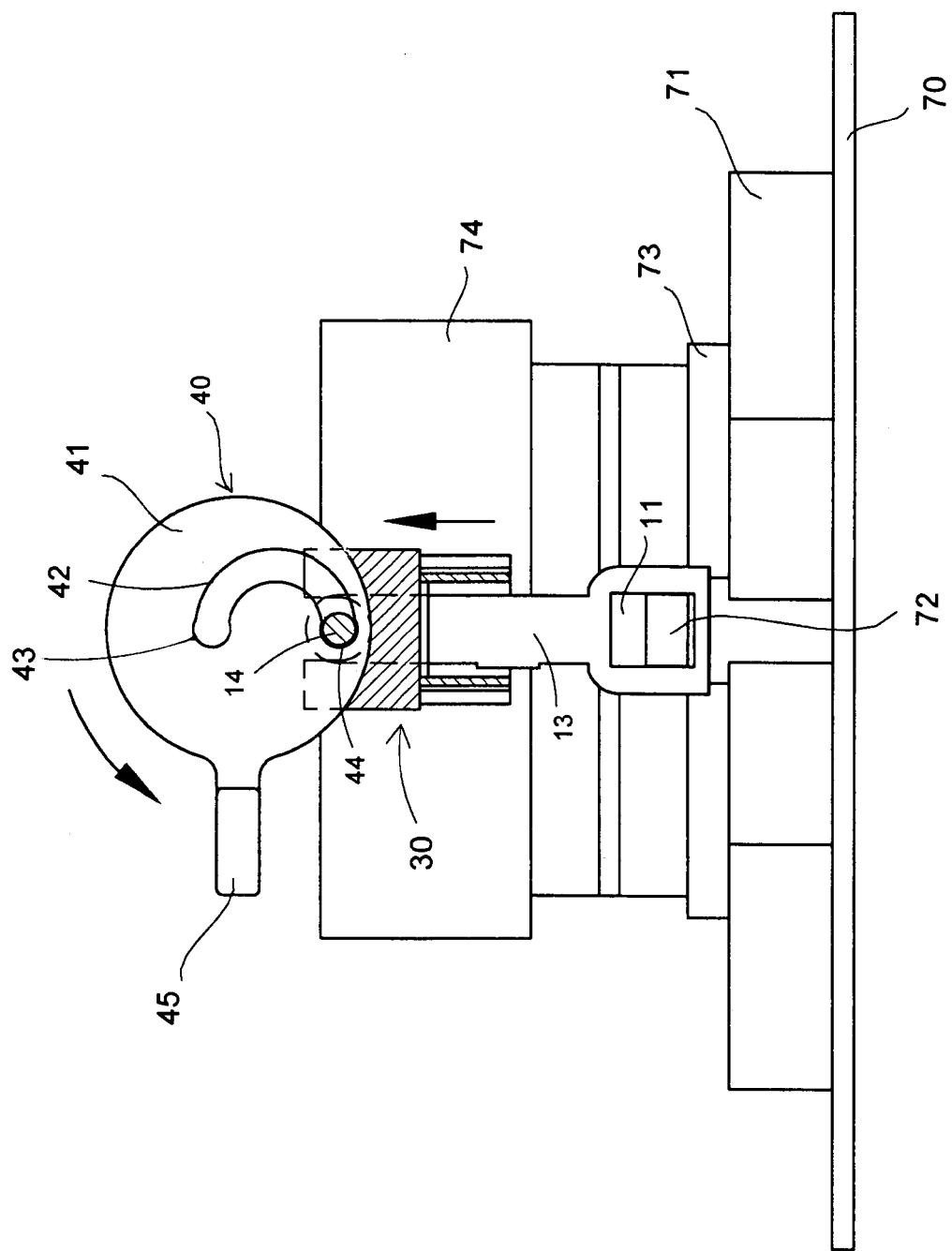
FIG. 7 is a front view showing the loose state of the retaining state according to the preferred embodiment of the invention.
Figure 8:
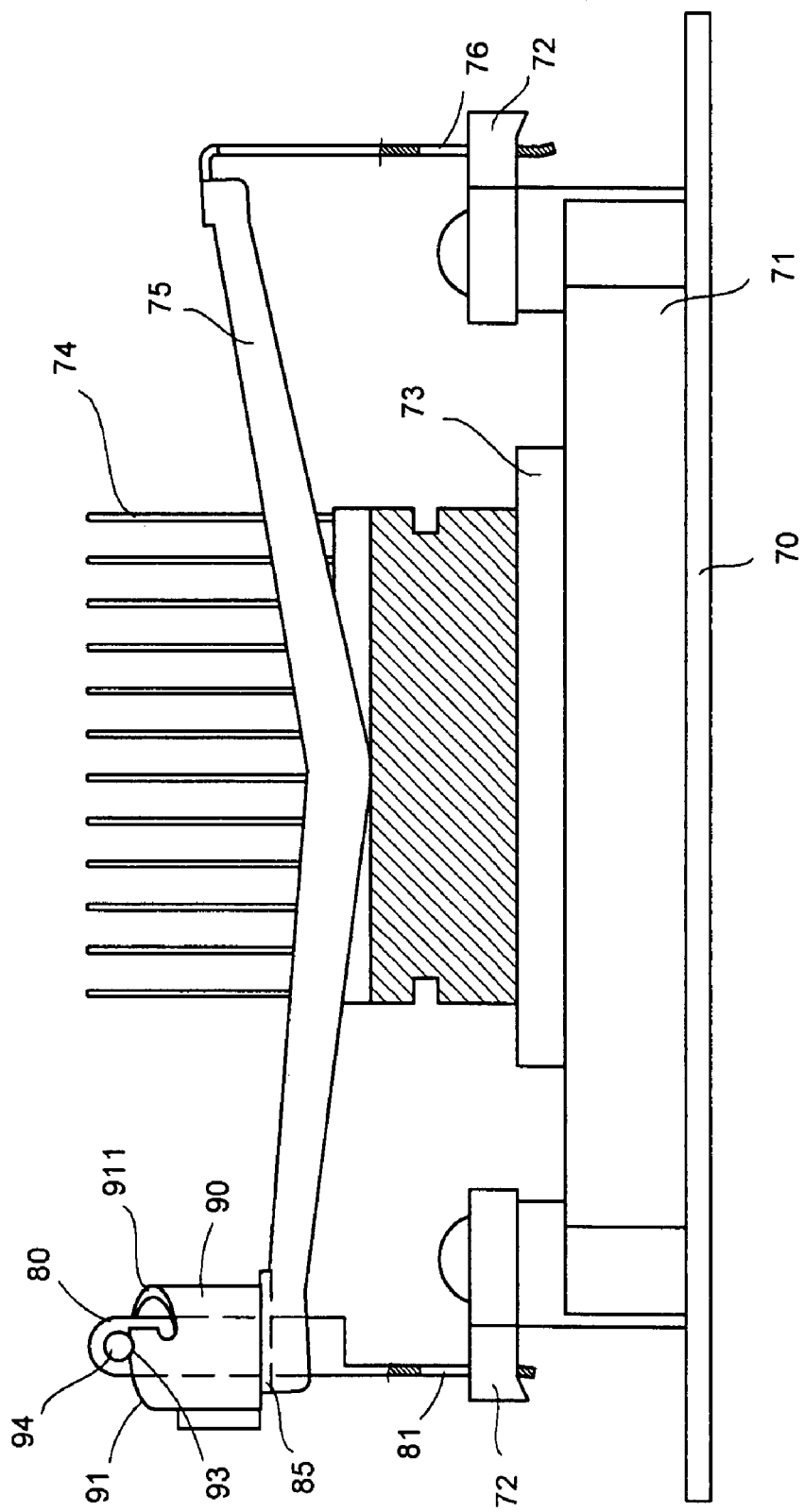
FIG. 8 is a cross-sectional side view showing a conventional retaining device.

On the contrary, as shown in FIGS. 6 and 7, the control member 40 is rotated so that the releasing point 44 of the control slot 42 is moved to the pivot 14 and the pivot 14 moves the retaining piece 10 downwards. Thus, the inner bottom edge of the retaining hole 11 and the engaging block 72 may be loose, and the connection seat 30 is relatively moved upwards along the retaining piece 10 to release the retaining arm 20 so that the retaining arm 20 is loose on the heat sink 74. Consequently, the retaining arm 20 and the control member 40 may be disassembled from the heat sink 74.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A retaining device for a heat sink, the retaining device comprising:

a retaining piece having a distal end formed with a retaining hole, and a top end formed with two opposite tabs, wherein one side of the retaining piece is connected to a connection section;

a retaining arm having an inverse L-shape, wherein a vertical surface at one side of the retaining arm is formed with a retaining hole, an end plane at the other side of the retaining arm is formed with through holes through which the tabs penetrate, and the plane is stopped by the connection section;

a connection seat pressing against the plane of the retaining arm, wherein open slots are formed on two symmetrical sides of the connection seat and facing the tabs, the other two symmetrical sides of the connection seat are integrally formed with an accommodating slot, and the connection seat is formed with scarf joints corresponding to the tabs passing through the connection seat; and a control member having a disk and a handle connected to an outer periphery of the disk, wherein a thickness section of the disk is accommodated in the accommodating slot, the handle is exposed out of the connection seat, the disk is formed with a hollow and eccentric control slot corresponding to a top side of each of the tabs so that a pivot may slide in the control slot, the control member in the accommodating slot is rotated and the pivot is driven by the control member to cause a relative movement between the retaining piece and the retaining arm.

2. The retaining device according to claim 1, wherein each of the tabs is formed with a through hole, and the through holes of the tabs have the same axis.

3. The retaining device according to claim 1, wherein the retaining arm has an inverse L-shape.

4. The retaining device according to claim 1, wherein each of the open slots of the connection seat has an U-shape, the accommodating slot is a curved accommodating slot, the connection seat is further formed with the scarf joints on two inner sidewalls of the open slots and facing corners of the open slots, and the scarf joints are aligned with the through holes of the plane, respectively, so that the scarf joints allow the tabs of the retaining piece to slide therein.

5. The retaining device according to claim 1, wherein the disk of the control member is a circular flat block.

6. The retaining device according to claim 1 or 5, wherein the control slot of the control member has an arced shape, one end of the control slot is a locking point near a center of the disk, and the other end of the control slot is a releasing point near an outer periphery of the disk.

7. The retaining device according to claim 5, wherein the handle is connected to one side of the disk and extends radially from a center of the disk.

8. The retaining device according to claim 5, wherein small convexities are formed near lowest and highest points of the control slot so that the control slots are formed with two bottlenecks at the two points.

* * * * *